(12) United States Patent
Liu

(10) Patent No.: US 11,898,001 B2
(45) Date of Patent: Feb. 13, 2024

(54) ORGANIC POLYMER HAVING ASYMMETRIC STRUCTURE AND USE THEREOF AS PHOTOELECTRIC MATERIALS

(71) Applicant: CHINA THREE GORGES CORPORATION, Beijing (CN)

(72) Inventor: Dongxue Liu, Beijing (CN)

(73) Assignee: CHINA THREE GORGES CORPORATION, Beijing (CN)

( * ) Notice: Subject to any disclaimer, the term of this patent is extended or adjusted under 35 U.S.C. 154(b) by 0 days.

(21) Appl. No.: 17/311,243

(22) PCT Filed: Nov. 10, 2020

(86) PCT No.: PCT/CN2020/127809
§ 371 (c)(1),
(2) Date: Jun. 4, 2021

(87) PCT Pub. No.: WO2021/143316
PCT Pub. Date: Jul. 22, 2021

(65) Prior Publication Data
US 2022/0363812 A1 Nov. 17, 2022

(30) Foreign Application Priority Data
Jan. 17, 2020 (CN) .......................... 202010051644.9

(51) Int. Cl.
*C08G 61/12* (2006.01)
*H10K 85/10* (2023.01)
(52) U.S. Cl.
CPC ......... *C08G 61/126* (2013.01); *C08G 61/124* (2013.01); *H10K 85/113* (2023.02);
(Continued)

(58) Field of Classification Search
CPC ............... C08G 61/126; C08G 61/124; C08G 2261/3241; C08G 2261/3243;
(Continued)

(56) References Cited

U.S. PATENT DOCUMENTS

2012/0186652 A1  7/2012  Pan et al.
2012/0220713 A1*  8/2012  He ...................... C08G 61/126
                                                              526/204

FOREIGN PATENT DOCUMENTS

CN          108864415 A      11/2018
CN          109627428 A       4/2019
(Continued)

OTHER PUBLICATIONS

International Search Report of PCT/CN2020/127809.
Written Opinion of PCT/CN2020/127809.

*Primary Examiner* — Shane Fang
(74) *Attorney, Agent, or Firm* — Dragon Sun Law Firm, PC

(57) ABSTRACT

An organic polymer having an asymmetric structure, a preparation method thereof and a use as a photoelectric material thereof, where the organic polymer with an asymmetric structure is obtained by polymerization after performing Stille coupling reaction between an electron-donating unit D and an electron-withdrawing unit A in the presence of a solvent and a catalyst. The compound of the present application has good heat stability, controllable absorption level, and is suitable for the preparation of hole transport materials of high-performance perovskite solar cells with high efficiency, flexibility, good stability and a large area as well as donor materials of organic solar cells.

1 Claim, 9 Drawing Sheets

(52) U.S. Cl.
CPC ............. *H10K 85/151* (2023.02); *C08G 2261/3241* (2013.01); *C08G 2261/3243* (2013.01); *C08G 2261/3244* (2013.01); *C08G 2261/414* (2013.01); *C08G 2261/512* (2013.01); *C08G 2261/592* (2013.01); *C08G 2261/91* (2013.01)

(58) Field of Classification Search
CPC ...... C08G 2261/3244; C08G 2261/414; C08G 2261/512; C08G 2261/592; C08G 2261/91; H10K 85/113; H10K 85/151
See application file for complete search history.

(56) References Cited

FOREIGN PATENT DOCUMENTS

| | | | | |
|---|---|---|---|---|
| CN | 110028654 A | 7/2019 | | |
| CN | 111269399 A | 6/2020 | | |
| JP | 2013235904 | * 11/2013 | ........... | Y02E 10/549 |
| WO | 2010108873 A1 | 9/2010 | | |

* cited by examiner

ORGANIC POLYMER HAVING ASYMMETRIC STRUCTURE AND USE THEREOF AS PHOTOELECTRIC MATERIALS

FIELD OF TECHNOLOGY

The present application relates to the field of materials chemistry. More specifically, the present application relates to the field of photoelectric materials.

BACKGROUND

In recent years, organic-inorganic hybridized perovskite solar cells have developed rapidly; and the photoelectric conversion efficiency has increased to 25.2% at present from 3.8% in 2009.

The perovskite solar cell is featured by high efficiency, low cost and solution machinability; meanwhile, perovskite material has the advantages of strong absorption, high migration rate, long carrier lifetime, adjustable band gap, and the like. Proper hole transport materials are inserted between perovskite materials and metal electrodes to promote the separation of electrons from holes on a functional layer interface, reduce charge recombination, thus facilitating hole transport, improving cell efficiency and enhancing the stability of device. Currently, the widely used hole transport materials (Spiro-OMeTAD and PTAA(poly(tri-arylamine))) are generally expensive, and require to be doped with a water-absorbing additive to achieve higher efficiency, which sacrifices the stability of device. Therefore, it has profound significance to develop novel hole transport materials with low cost and superior performance, improve the efficiency of perovskite solar cells, stability of device and promote the commercial application of perovskite solar cells.

SUMMARY

On one hand, the present application relates to an asymmetric polymer selected from compounds (1) to (5):

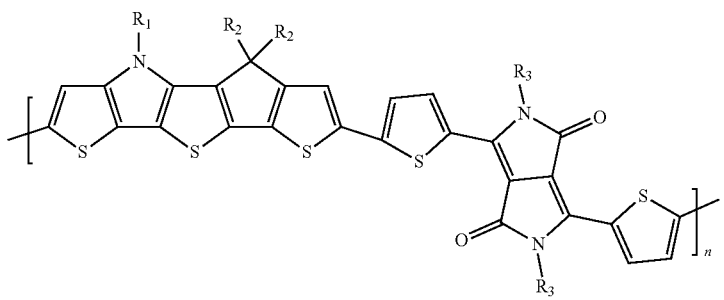

1-1

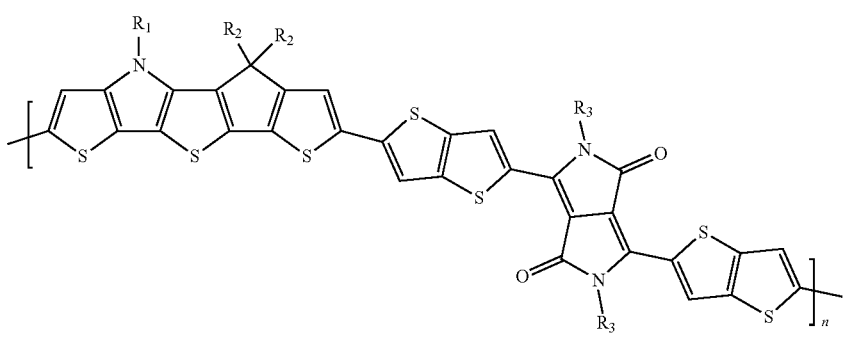

1-2

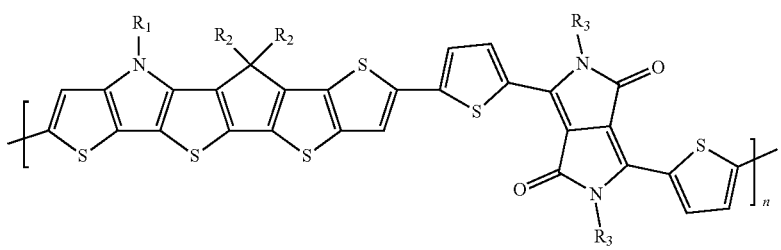

2-1

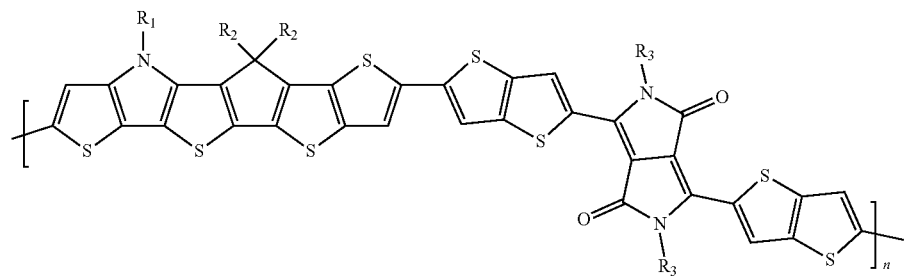
2-2
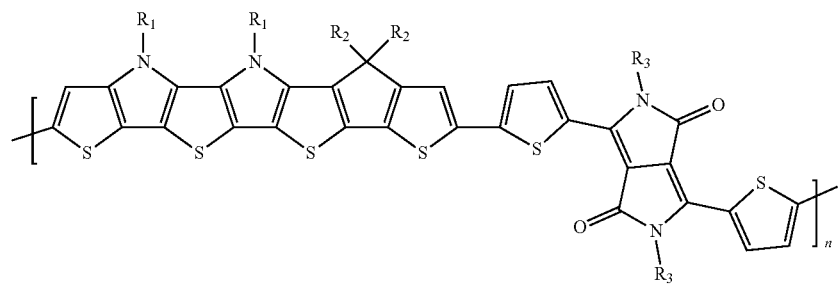
3-1
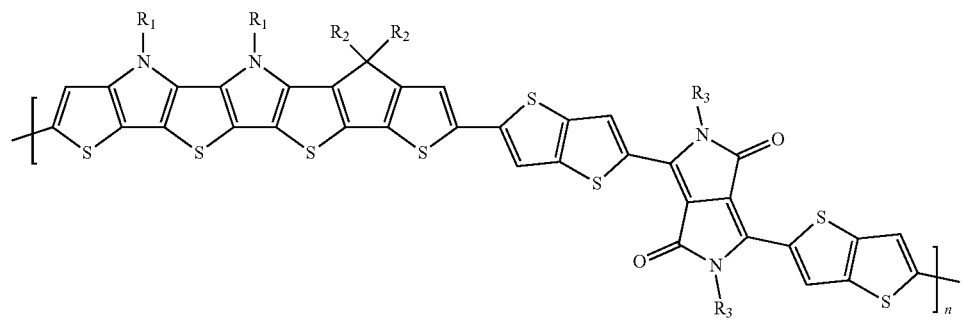
3-2
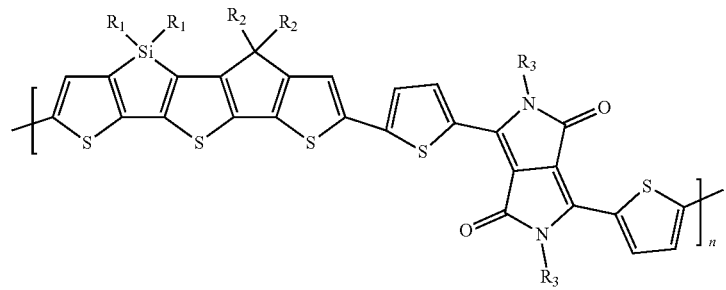
4-1
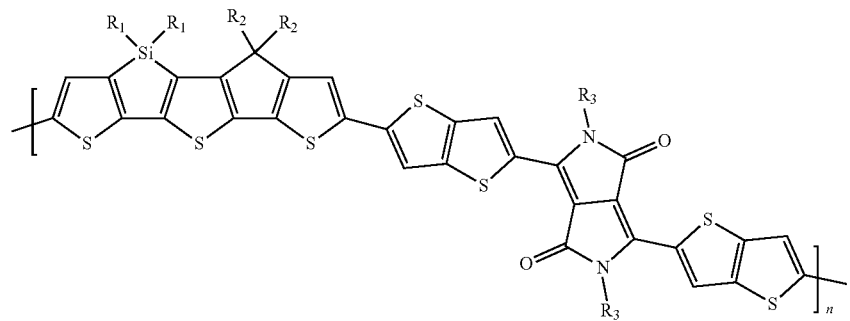
4-2

5-1

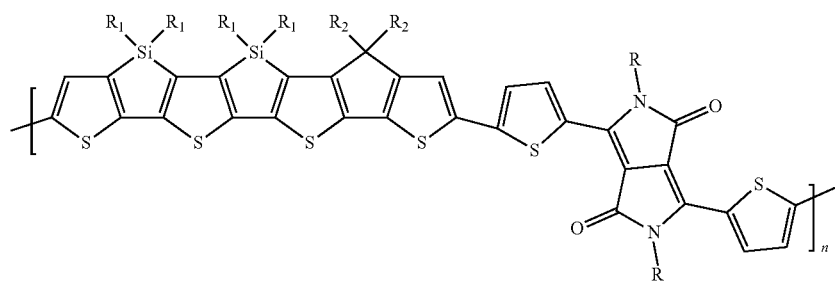

5-1

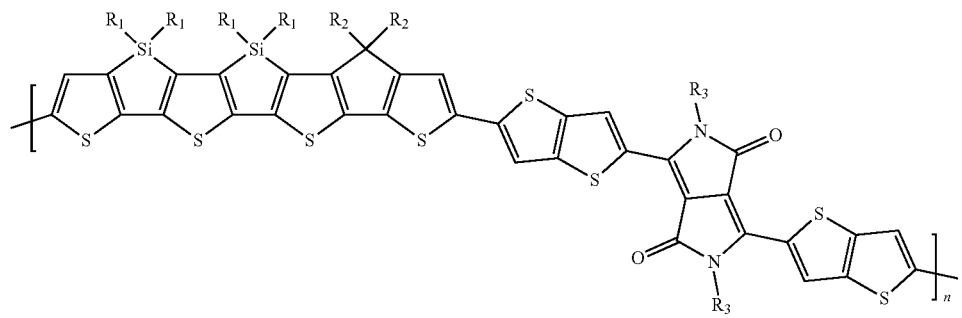

where, $R_1$ is respectively and independently selected from any one of $C_1$-$C_{30}$ alkyl, $C_3$-$C_{30}$ cycloalkyl and $C_1$-$C_{30}$ alkoxy.

$R_2$ is respectively and independently selected from any one of groups 7 to 12:

7

8

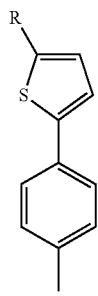

9

10

11

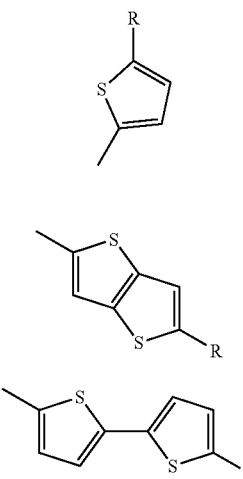

-continued

12

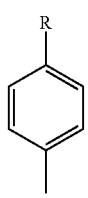

where, R is selected from $C_1$-$C_{30}$ alkyl, $C_3$-$C_{30}$ cycloalkyl and $C_1$-$C_{30}$ alkoxy; and n>4.

and, $R_3$ is respectively and independently selected from $C_6$-$C_{30}$ alkyl, $C_3$-$C_{30}$ cycloalkyl and $C_6$-$C_{30}$ alkoxy; or an oxygen-containing ether chain.

As a preferred embodiment, the asymmetric organic polymer has the following structural formula:

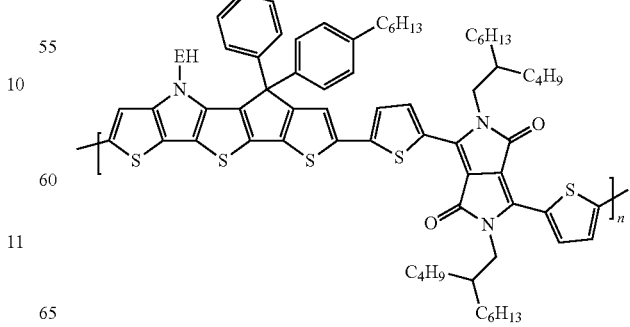

On one hand, the asymmetric organic polymer is obtained by polymerization after performing Stille coupling reaction between an electron-donating unit D and an electron-withdrawing unit A in the presence of a solvent and a catalyst.

The solvent is a mixed solvent, preferably, a mixed solvent of methylbenzene and N,N-methylformamide with a volume ratio of methylbenzene:N,N-methylformamide=6-10:1.

The catalyst is $Pd_2(dba)_3$ or $Pd(PPh_3)_4$.

The method is performed under a shield gas, and the shield gas is preferably nitrogen or argon.

In one aspect, the present application relates to use of the asymmetric polymer containing the formulas (1) to (6) in the preparation of a perovskite solar cell.

In a further aspect, the present application relates to use of the asymmetric polymer containing the formulas (1) to (6) in a hole transport layer of a perovskite solar cell.

In a further aspect, as a kind of hole transport material, Spiro-OMeTAD requires to be configured with LiTFSI and t-BP as a dopant, and the dopant has strong water absorption, thus influencing the stability of the cell. Therefore, it is very significant to research and develop novel undoped hole transport materials, thus reducing the preparation cost of the cell, improving the stability of the device, and promoting the industrialization of perovskite solar cells.

DESCRIPTION OF THE EMBODIMENTS

Figure 1:
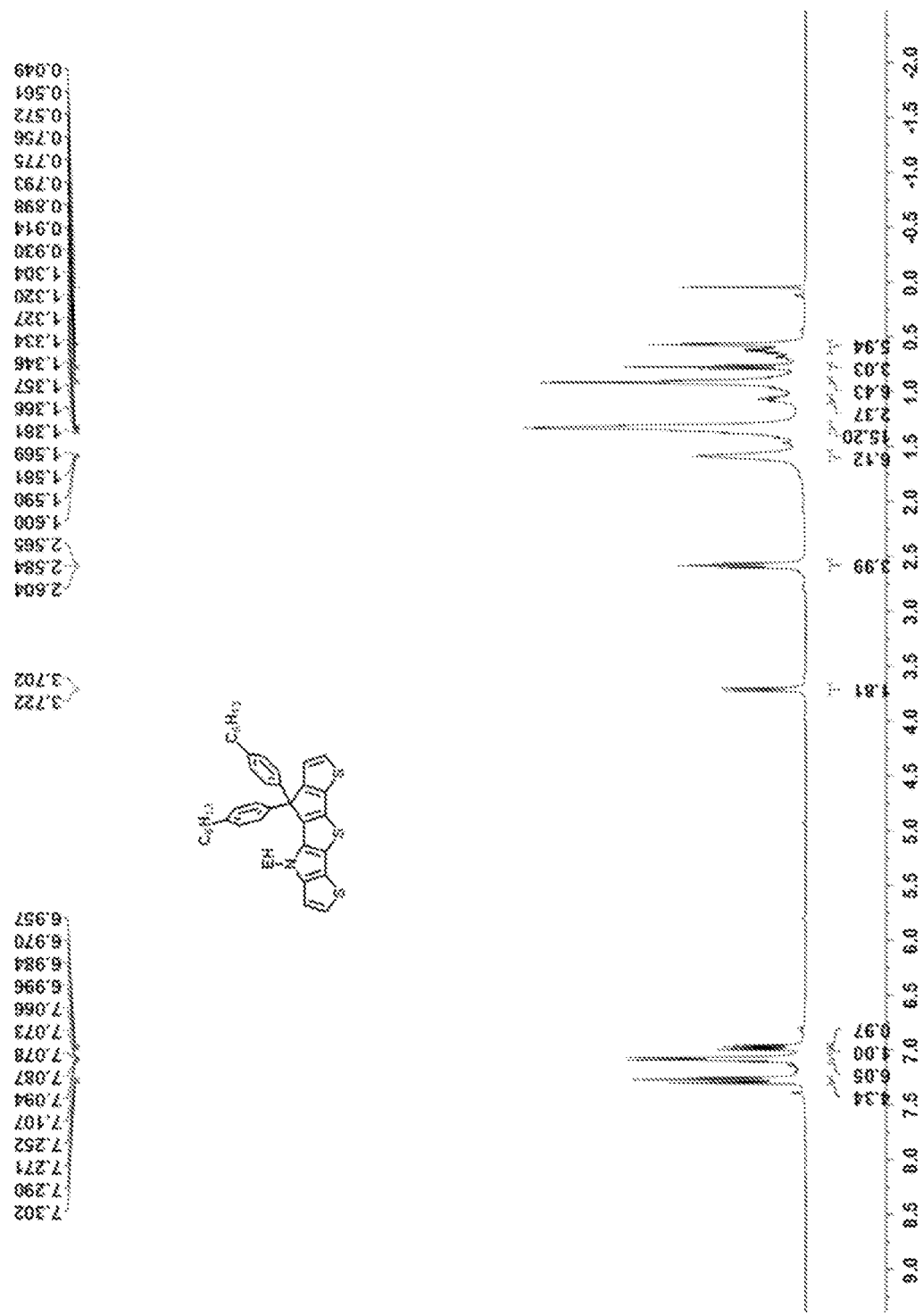
FIG. 1 shows a thermogravimetric curve of a compound 10 in example of the present application.
Figure 2:
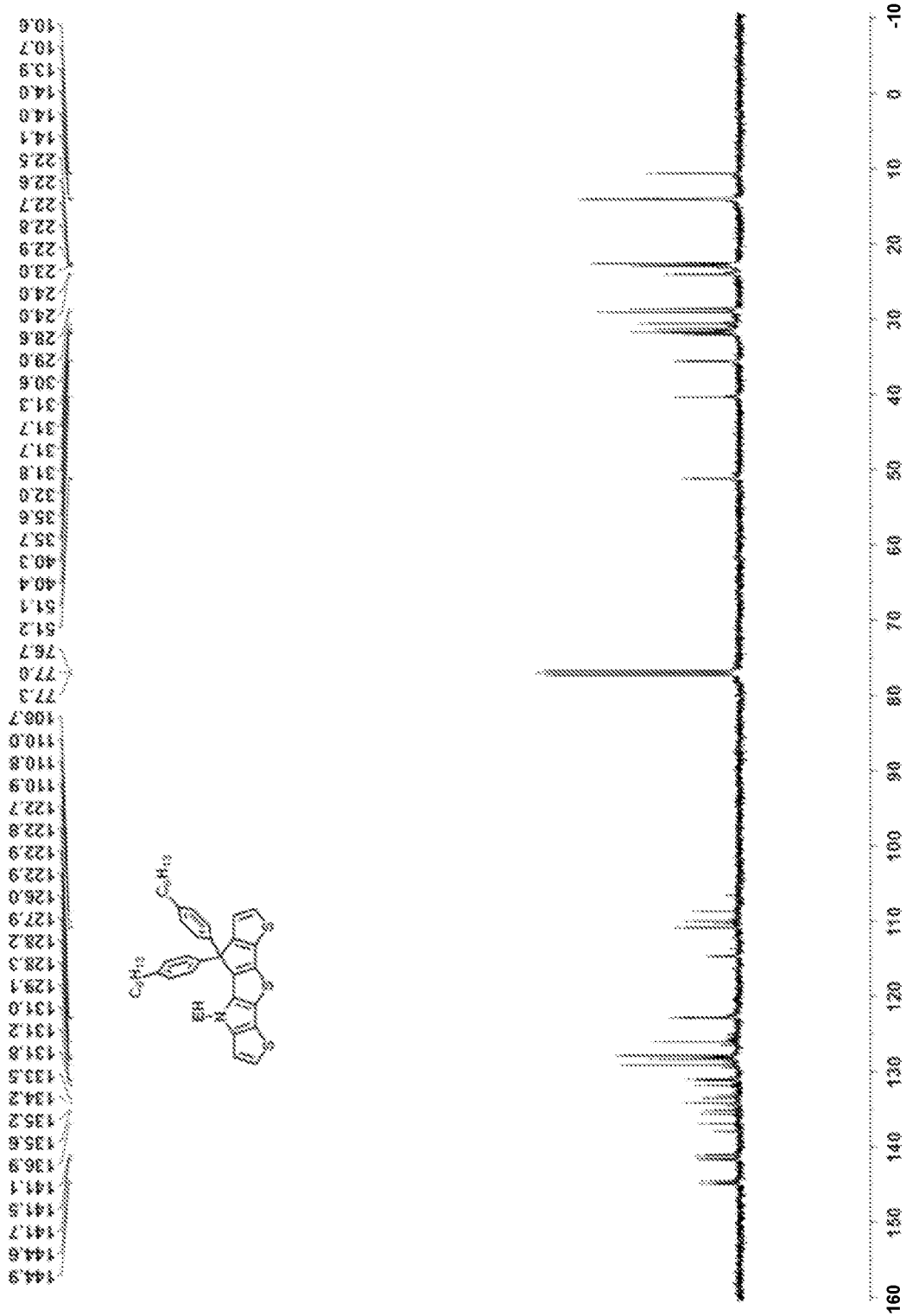
FIG. 2 shows a molecular weight-distribution curve of the compound 10 in example of the present application.
Figure 3:
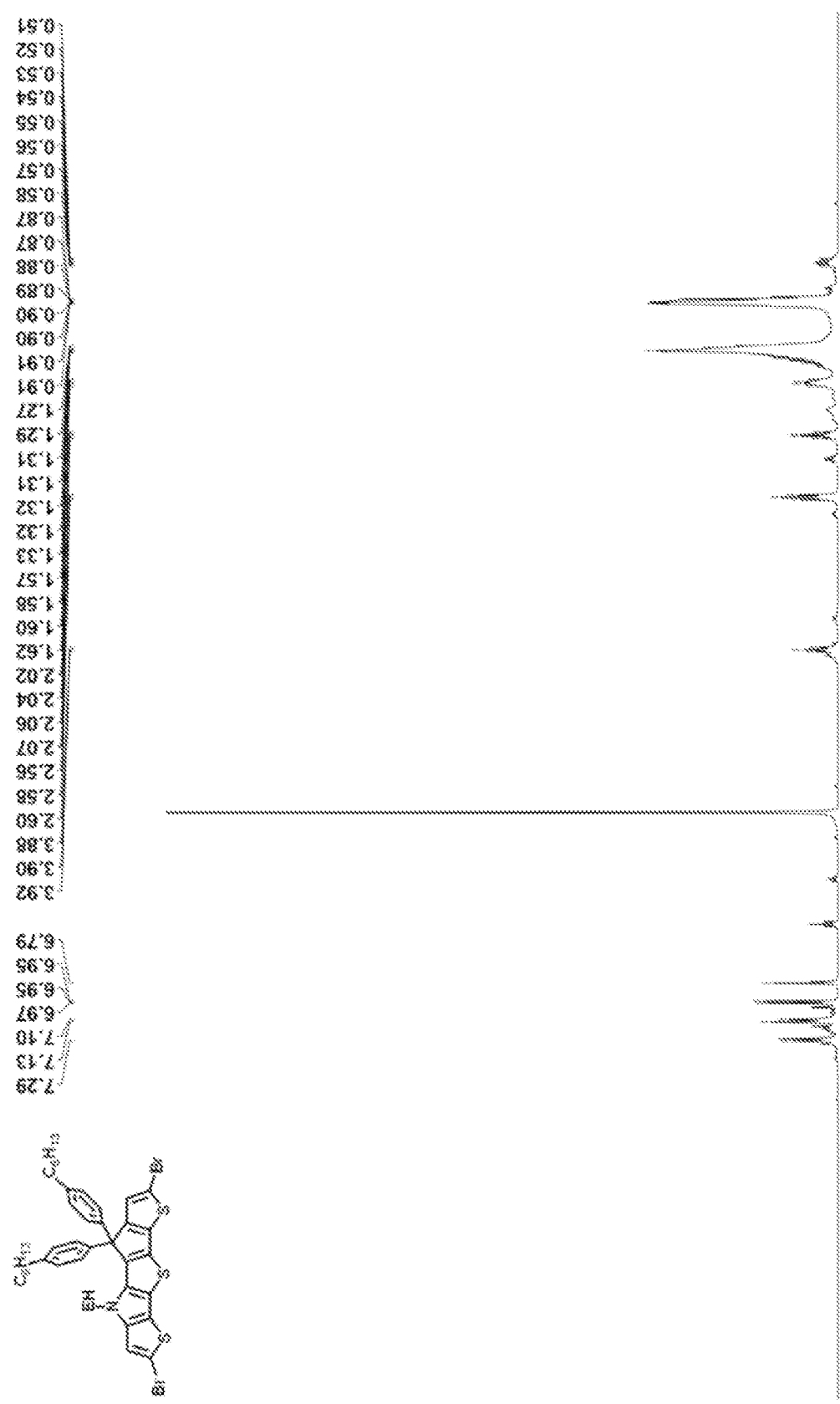
FIG. 3 shows an ultraviolet absorption curve of the compound 10 in example of the present application.
Figure 4:
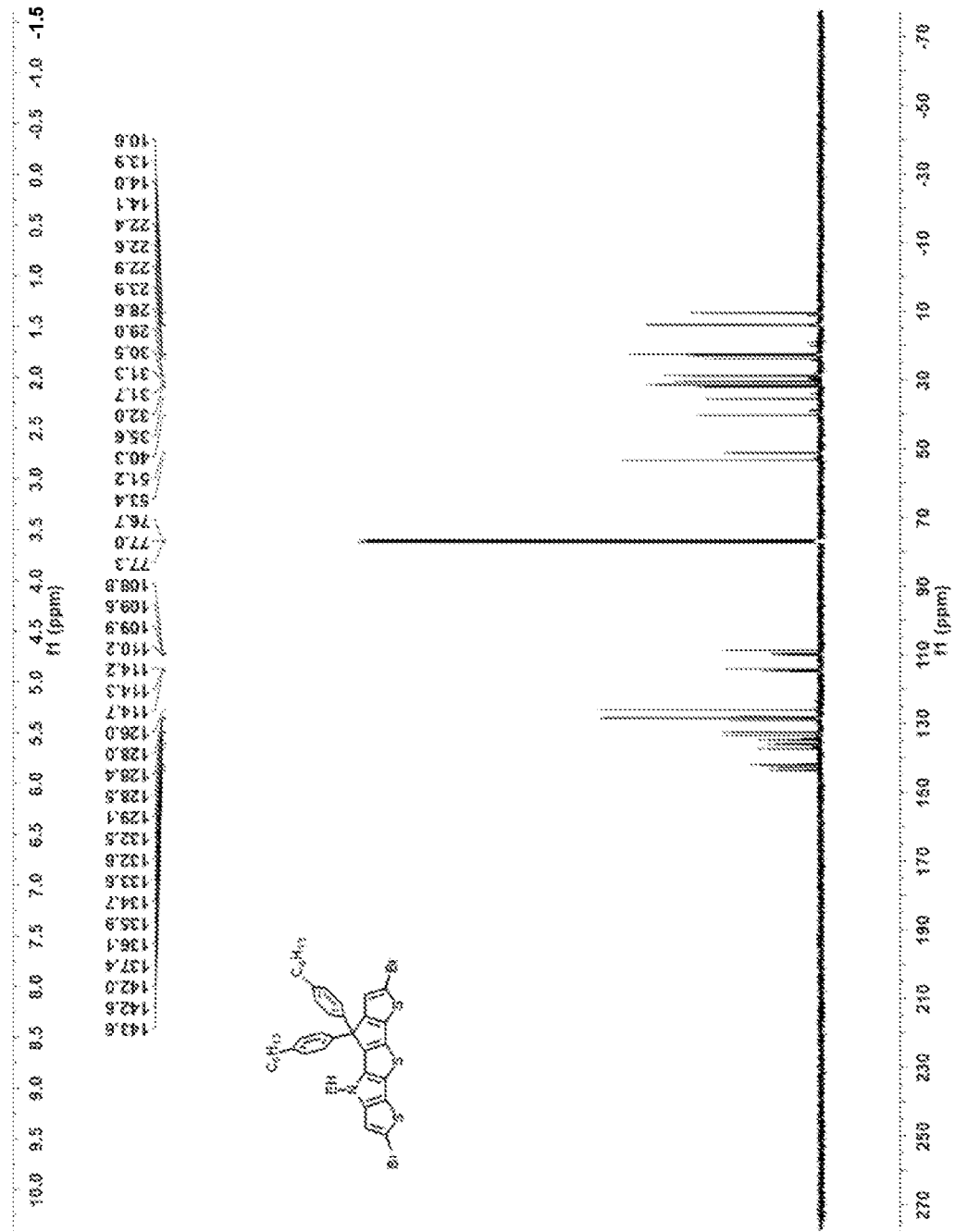
FIG. 4 shows a cyclic voltammetry curve of the compound 10 in example of the present application.

The description below includes certain specific details to provide a comprehensive understanding to the embodiments disclosed herein. However, a person skilled in the art will realize that embodiments may be achieved by using other methods, components, materials, and the like instead of using one or more these specific details.

Unless otherwise specified, the words "comprise" and "contain" in the whole description and succeeding claims should be explained as an open-ended and inclusive meaning, that is, "including but not limited to".

"One embodiment" or "embodiments" or "in another embodiment" or "in some embodiments" of the whole description means that at least one embodiment includes specific reference factors, structures or features associated with the embodiment. Therefore, the expression "in one embodiment", or "in embodiments", or "in another embodiment" or "in some embodiments" in different positions of the whole description does not necessarily refer to the same embodiment. Moreover, specific elements, structures or feature can be combined in one or more embodiments

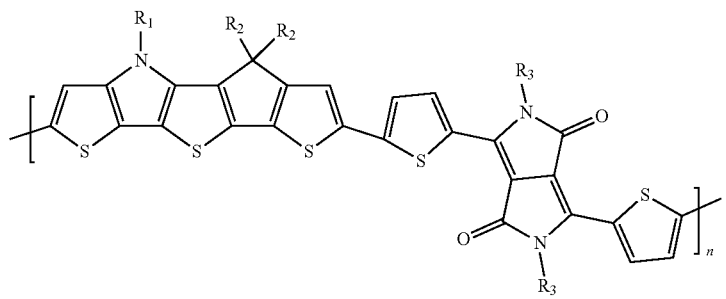

1-1

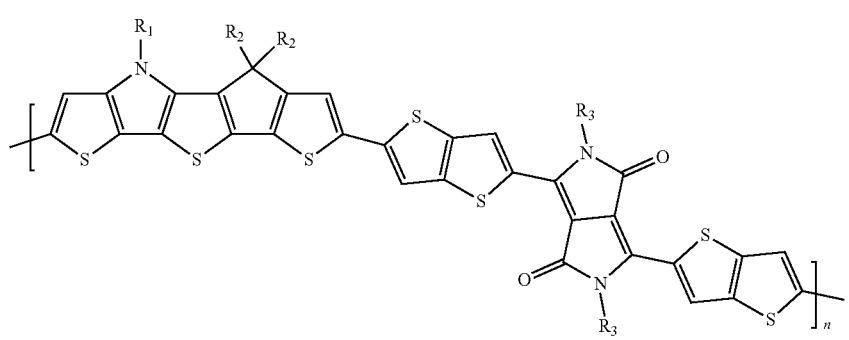

1-2

-continued
2-1
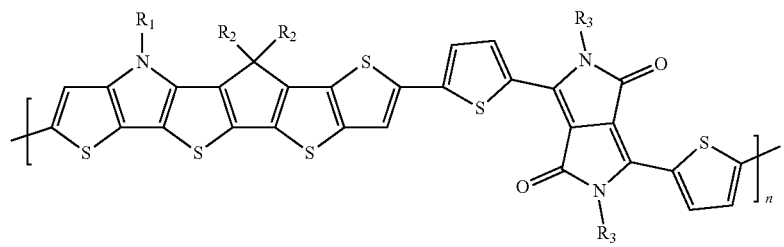
2-2
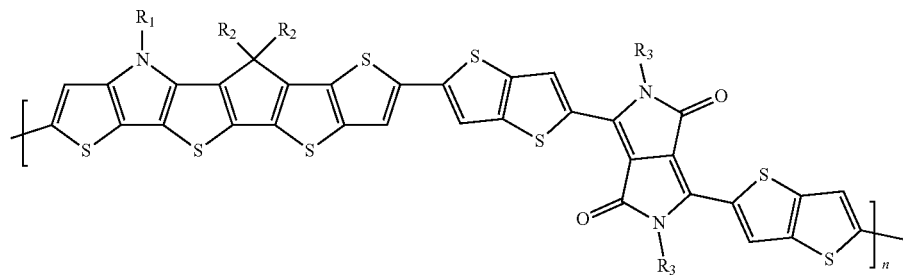
3-1
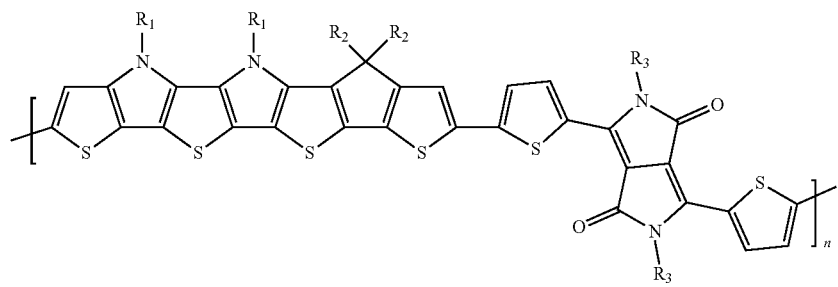
3-2
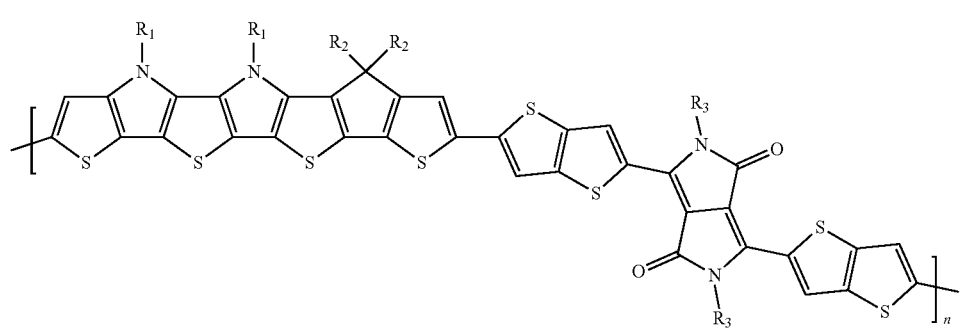
4-1
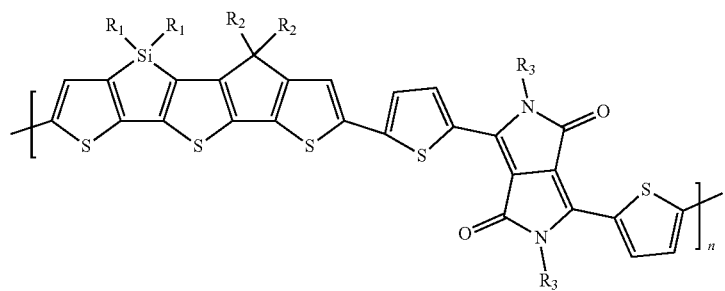

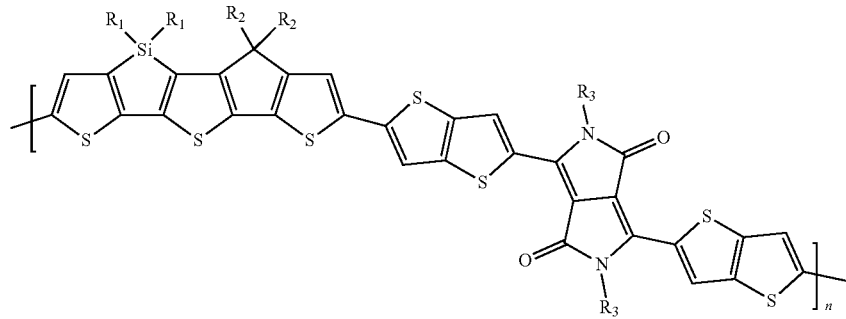
4-2
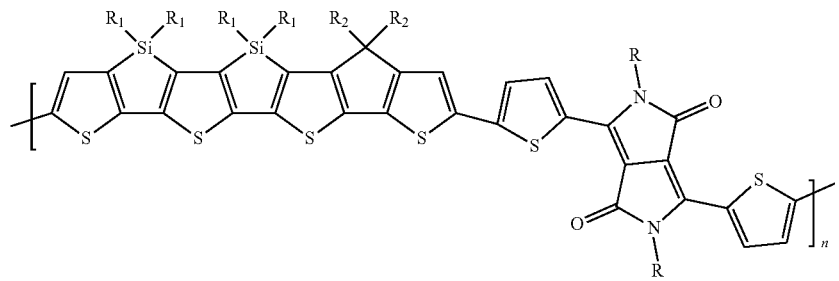
5-1
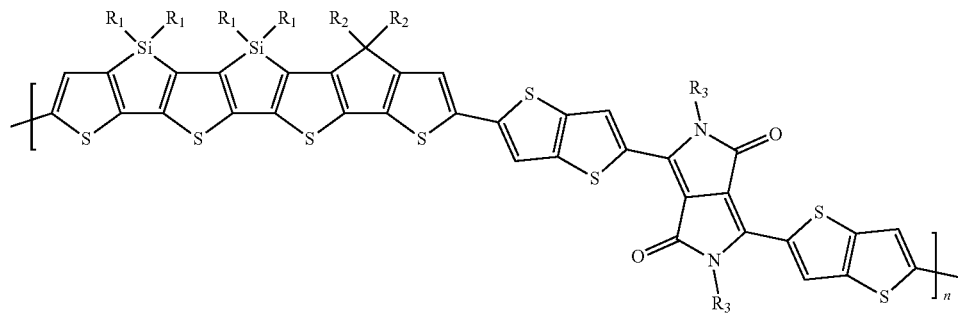
5-1
In some embodiments, the method for preparing the asymmetric polymer of the Formula (1) is as follows:
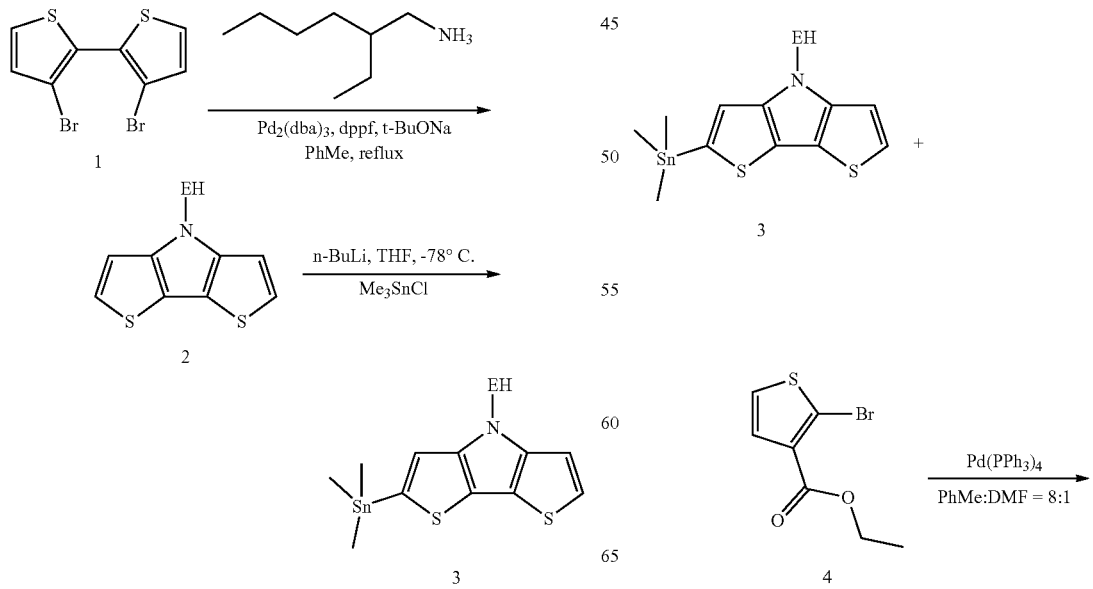

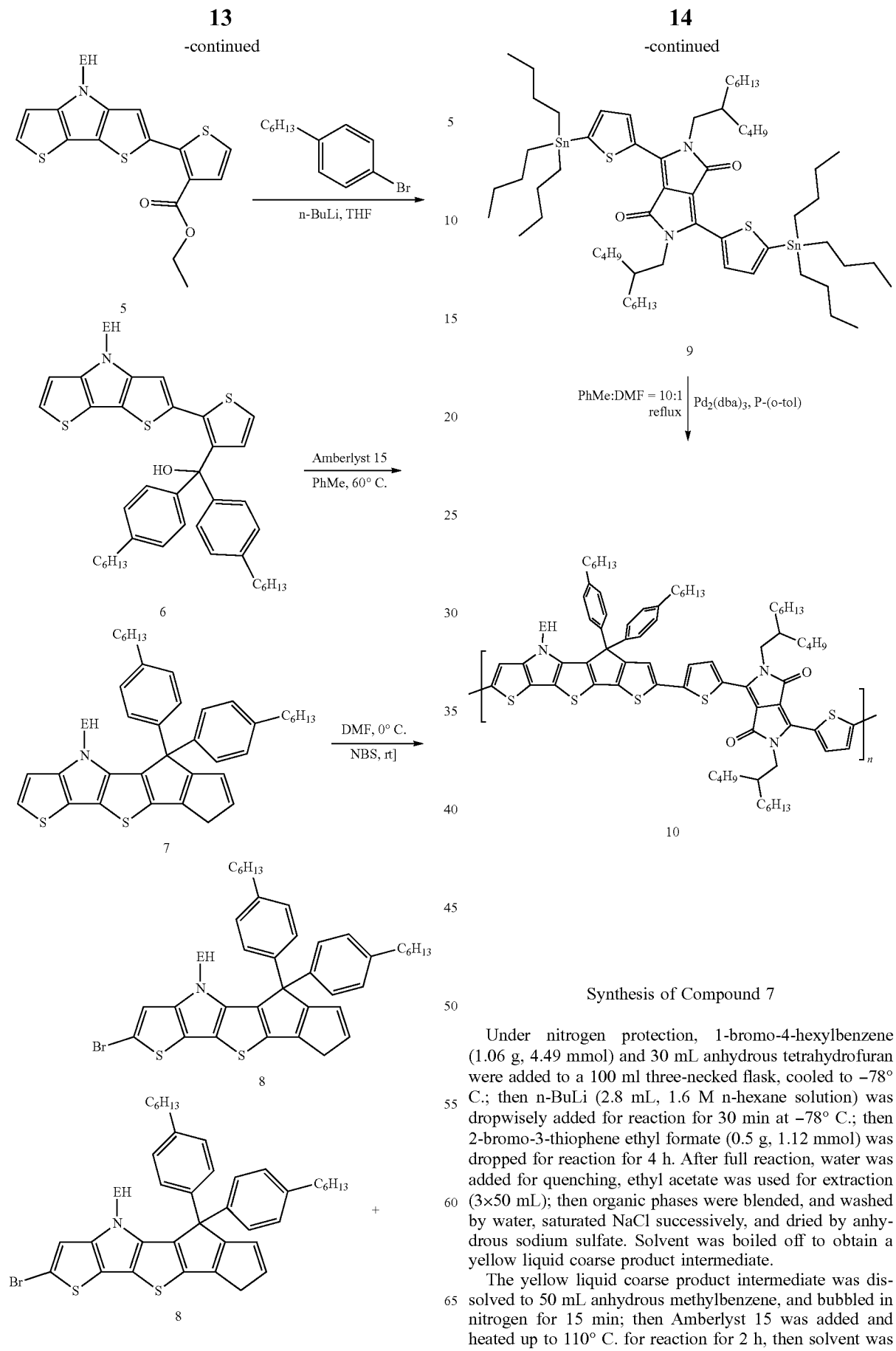

Synthesis of Compound 7

Under nitrogen protection, 1-bromo-4-hexylbenzene (1.06 g, 4.49 mmol) and 30 mL anhydrous tetrahydrofuran were added to a 100 ml three-necked flask, cooled to −78° C.; then n-BuLi (2.8 mL, 1.6 M n-hexane solution) was dropwisely added for reaction for 30 min at −78° C.; then 2-bromo-3-thiophene ethyl formate (0.5 g, 1.12 mmol) was dropped for reaction for 4 h. After full reaction, water was added for quenching, ethyl acetate was used for extraction (3×50 mL); then organic phases were blended, and washed by water, saturated NaCl successively, and dried by anhydrous sodium sulfate. Solvent was boiled off to obtain a yellow liquid coarse product intermediate.

The yellow liquid coarse product intermediate was dissolved to 50 mL anhydrous methylbenzene, and bubbled in nitrogen for 15 min; then Amberlyst 15 was added and heated up to 110° C. for reaction for 2 h, then solvent was boiled off, and the residue was purified by column chromatography with petroleum ether: dichloromethane (v/v=16:1) as an eluent to obtain a faint yellow solid compound 7 (0.3 g, two-step reaction to obtain a total yield of 37%). $^1$H NMR (400 MHz, CDCl3), δ (ppm): 7.28 (dd, J=13.9, 6.1 Hz, 4H), 7.12-7.03 (m, 6H), 6.99 (d, J=4.9 Hz, 1H), 6.96 (d, J=5.3 Hz, 1H), 3.71 (d, J=8.1 Hz, 2H), 2.58 (t, J=7.8 Hz, 4H), 1.59 (dd, J=8.1, 4.3 Hz, 6H), 1.38-1.27 (m, 15H), 1.11-1.03 (m, 2H), 0.91 (d, J=6.7 Hz, 6H), 0.77 (t, J=7.3 Hz, 3H), 0.57 (d, J=4.4 Hz, 6H). $^{13}$C NMR (101 MHz, CDCl$_3$) δ 144.94, 144.56, 141.69, 141.47, 141.08, 136.89, 135.61, 135.17, 134.21, 133.53, 133.50, 131.84, 131.24, 131.04, 129.10, 128.33, 128.16, 127.89, 126.04, 122.91, 122.87, 122.76, 122.70, 114.70, 114.63, 114.55, 110.89, 110.83, 110.32, 110.04, 108.68, 77.32, 77.00, 76.68, 51.19, 51.11, 40.38, 40.33, 35.68, 35.57, 32.02, 31.81, 31.71, 31.68, 31.32, 30.60, 29.03, 28.64, 24.03, 23.96, 22.96, 22.93, 22.85, 22.74, 22.58, 22.48, 14.08, 14.01, 13.96, 13.93, 10.65, 10.60.

Synthesis of Compound 8

7 (0.20 g, 0.28 mmol) and 30 ml dry trichloromethane were added to a 100 ml three-necked flask, replaced by nitrogen and cooled to 0° C.; then a DMF solution (2 mL) of NBS (79.6 mg, 0.62 mmol) was added for reaction in dark place for 30 min at 0° C. Organic solvent was boiled off under reduced pressure; petroleum ether was used as an eluent for direct column chromatography separation to obtain yellow solid 8 (0.19 g, 78.8%). $^1$H NMR (CDCl$_3$, 400 MHz), δ (ppm): S 7.29 (s, 1H), 7.12 (d, J=8.3 Hz, 4H), 6.96 (d, J=7.1 Hz, 4H), 6.79 (s, 1H), 3.90 (t, J=7.6 Hz, 2H), 2.58 (t, J=7.8 Hz, 4H), 2.04 (t, J=7.4 Hz, 3H), 1.59 (q, J=7.3 Hz, 6H), 1.33-1.27 (m, 24H), 0.88 (dd, J=8.1, 2.3 Hz, 14H), 0.55 (ddt, J=12.3, 7.2, 4.0 Hz, 2H).; $^{13}$C NMR (100 MHz, CDCl$_3$), δ (ppm): 143.64, 142.63, 142.03, 137.41, 136.08, 135.89, 134.68, 133.57, 132.59, 132.53, 129.06, 128.48, 128.43, 128.01, 126.03, 114.66, 114.27, 114.22, 110.21, 109.85, 109.62, 108.75, 77.32, 77.00, 76.68, 53.40, 51.24, 40.30, 35.56, 32.05, 31.69, 31.32, 30.55, 29.01, 28.60, 23.93, 22.92, 22.58, 22.41, 14.07, 13.98, 13.90, 10.57.

Synthesis of Compound 10

The compound 8 (80 mg, 0.113 mmol) and compound 9 (137 mg, 0.113 mmol) were dissolved to a mixed solvent of 4.5 mL methylbenzene and 0.5 mL N,N-dimethylformamide in a 25 mL three-necked flask, then bubbled in nitrogen for 15 min. 5.17 mg Pd$_2$(dba)$_3$ and p-(o-tol) 6 mg were added for heating reflux for 4 h till the solution was viscous, after cooling, the solution was loaded to 100 mL absolute methanol for sedimentation, then filtered by suction; a Soxhlet extractor was used for purification, and column chromatography was used for secondary purification to obtain 0.1 g black blue solid 10.

Heat stability test on compound 10

Figure 5:
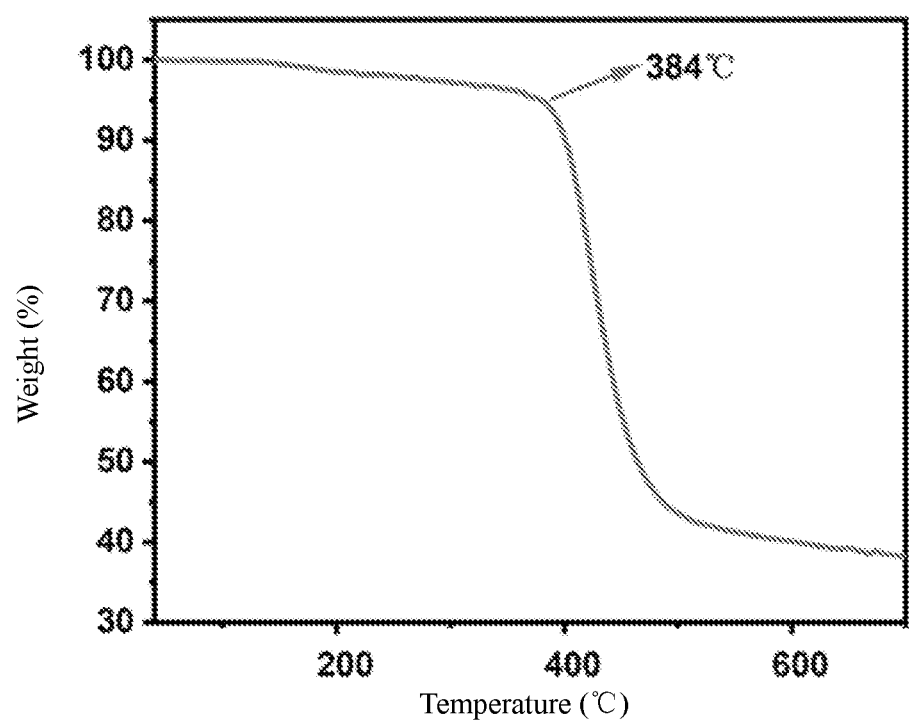
FIG. 5 shows a cell structure of the compound 10 in example of the present application used for a hole transport layer of a perovskite solar cell.
Figure 6:
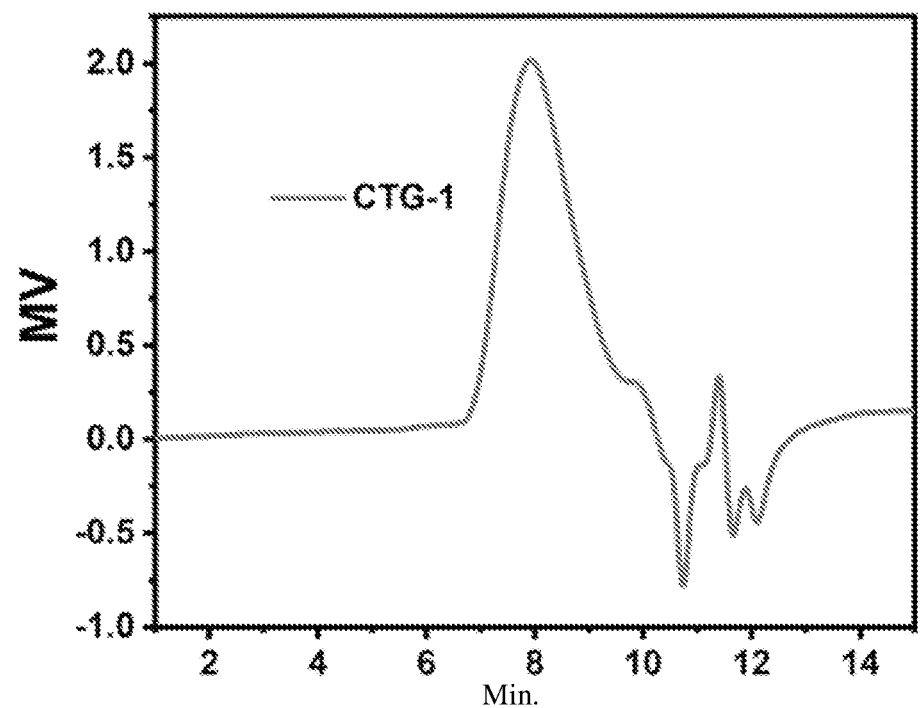
FIG. 6 shows an electric current density-voltage curve of the compound 10 in example of the present application.

Heat stability of the compound 10 was conducted on a TA instrument SDT-TG Q600 thermal gravimetric analyzer by thermogravimetric analysis (TG); and under nitrogen flow, the heating scanning rate was 10° C./min, as shown in FIGS. 5 and 6.

Ultraviolet absorption test on compound 10

Figure 7:
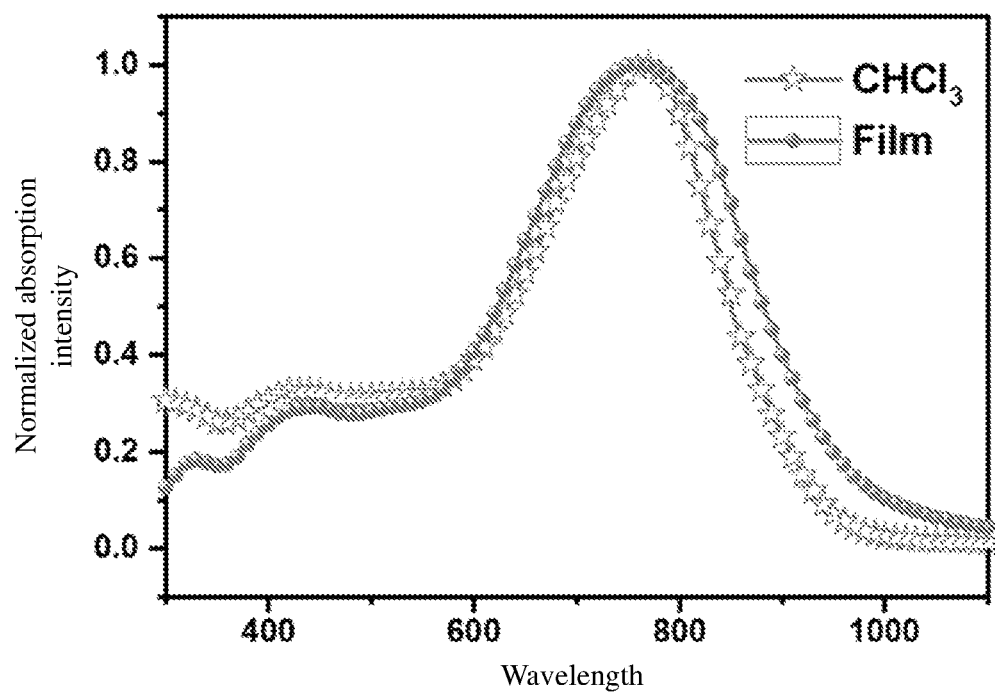
FIG. 7 shows an absorption spectrogram of the compound 10 in example of the present application under UV-Vis.

In the present invention, UV-Vis was used for testing the absorption spectrum of the compound 10 under the state of solution and film, and the test results were shown in FIG. 7.

Energy level test on compound 10

Figure 8:
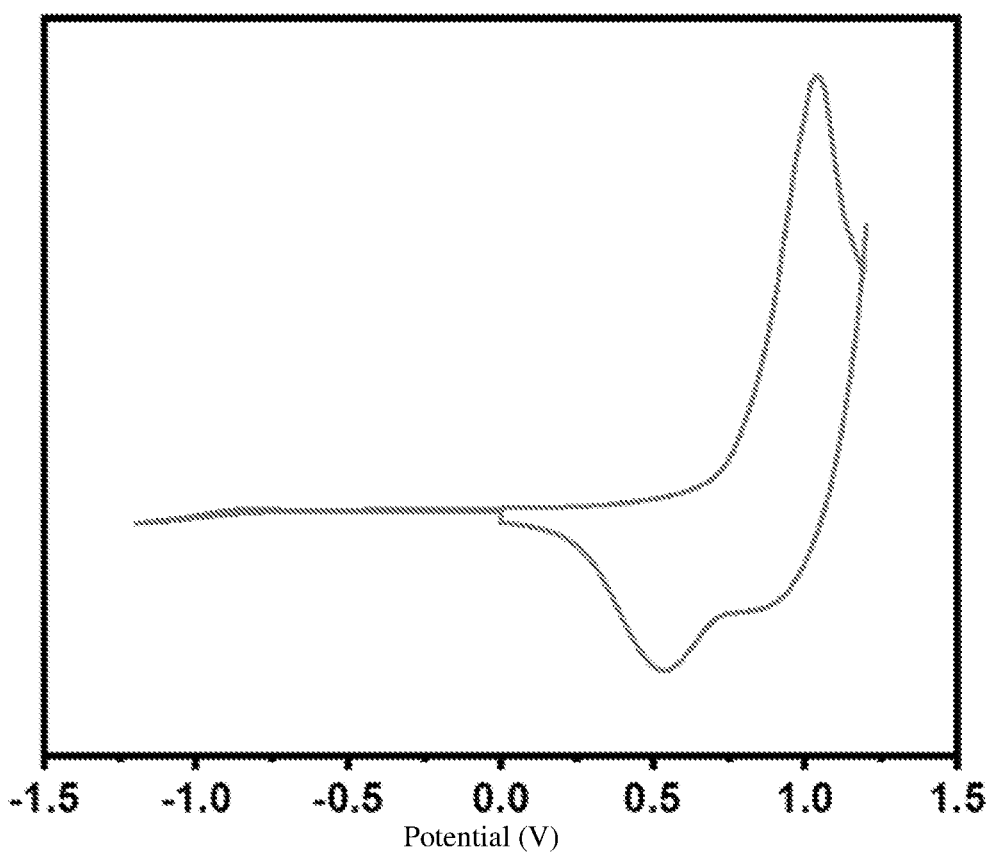
FIG. 8 shows a cyclic voltammetry curve of the compound 10 in example of the present application under argon shield.

The test on electrochemical property was performed in an electrochemical workstation of a CHI 600E electrochemical analyser from Shanghai Huachen; and an electrolytic cell is a three-electrode system (glassy carbon electrode as a working electrode, platinum wire electrode as an auxiliary electrode, and calomel electrode as a reference electrode); ferrocene served as an internal standard, 0.1 M tetrabutylammonium hexafluorophosphate (n-Bu$_4$NPF$_6$) served as a supporting electrolyte, and scanning speed was 100 mV s$^{-1}$. Under argon shield, the cyclic voltammetry curve was shown in FIG. 8 and Table 1.

TABLE 1

| | Optical and electrochemical performance data of compound 10 | | | | | |
|---|---|---|---|---|---|---|
| | Solution absorption | Film absorption | | | CV | |
| molecules | $\lambda_{max}$ (nm) | $\lambda_{max}$ (nm) | $\lambda_{onset}$ (nm) | $E_g^{opt}$ (V) | HOMO (eV) | LUMO (eV) | $E_g^{elec}$ (eV) |
| Compound 10 | 766 | 770 | 982 | 1.26 | −5.15 | −3.57 | 1.58 |

Figure 9:
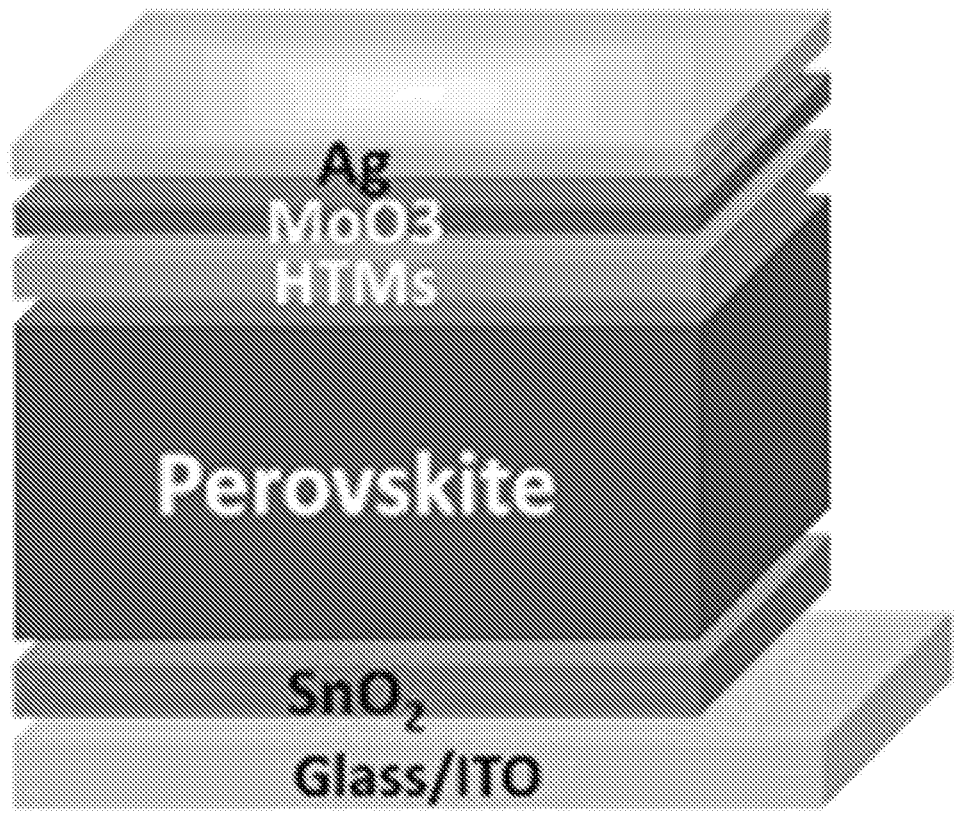
FIG. 9 shows a structure of a photovoltaic device.

Preparation of a Perovskite Solar Cell Device with Compound 10 in Example as a Hole Transport Layer Preparation of a Photovoltaic Device The device structure was ITO/SnO$_2$/Perovskite/HTM/MoO$_3$/Ag, as shown in FIG. 9. Specific steps were as follows:

(1) Substrate cleaning Firstly, an etched ITO glass substrate was subjected to ultrasonic cleaning successively by a detergent water, deionized water, acetone and isopropanol for 15 min, then cleaned ITO glass was blow-dried by high-purity nitrogen, then processed by UV/O3 for 20 min to clean the organic pollutant on the surface and enhance the wettability on the surface.

(2) Preparation of an electron transfer layer and a perovskite active layer Firstly, ITO substrate was spin-coated with a SnO$_2$ transport layer; then filtered by a 0.22 m PES aqueous filter membrane for spin-coating for 30 s at 3000 rpm, and then transferred onto a heating plate for annealing for 30 min at 150° C. Afterwards, the ITO/SnO$_2$ substrate was transferred to a nitrogen glovebox, after cooling, spin-coated with 1.IM PbI$_2$ DMF solution for spin-coating for 30 s at 1500 rpm, and heated for 15 min at 70° C., then spin-coated with an isopropanol solution of FAI:MAI:MACl=51:9:12 salt for spin-coating for 30 s at 2000 rpm. Then the solution was transferred out of the glovebox, and annealed for 30 min at 100° C. Then, the substrate spin-coated with perovskite was transferred into a nitrogen glovebox, and then spin-coated with a dichlorobenzene solution (8 mg/ml, CB) of the compound 10 for spin-coating for 40 s at 1500 rpm.

Figure 10:
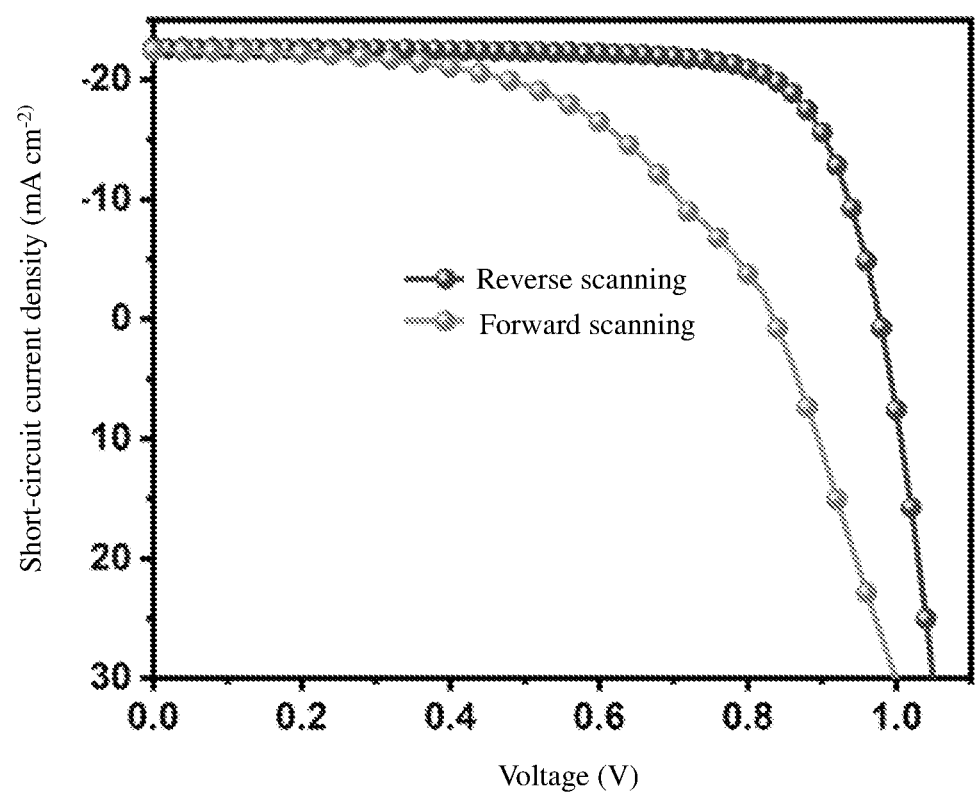
FIG. 10 shows an electric current density-voltage curve.

(3) Metal electrodes were subjected to evaporation. 15 nm-thickness MoO3 was evaporated under high vacuum degree (<1×10-4 Pa), and then Ag electrodes were evaporated. Each cell had an active area of 0.1 cm$^2$. Electric current density-voltage curve was shown in FIG. 10.

Compounds 11-14 were synthesized by the steps of the above compound 10, as shown in the table below:
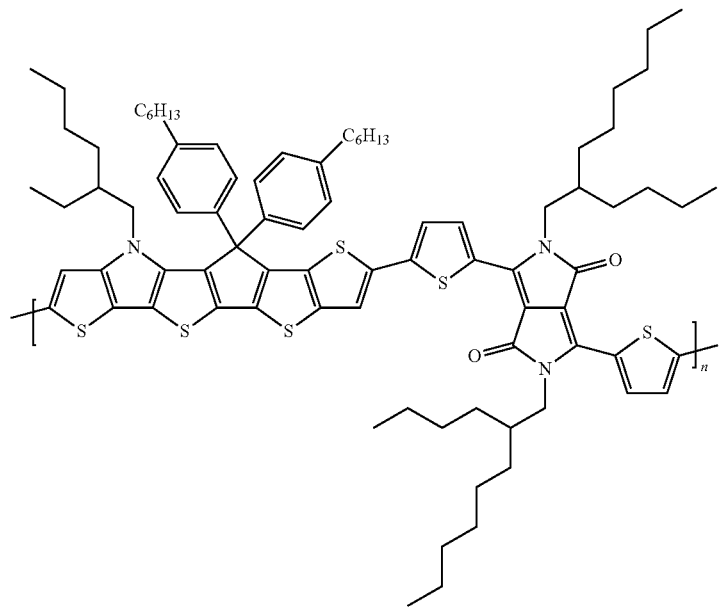
11
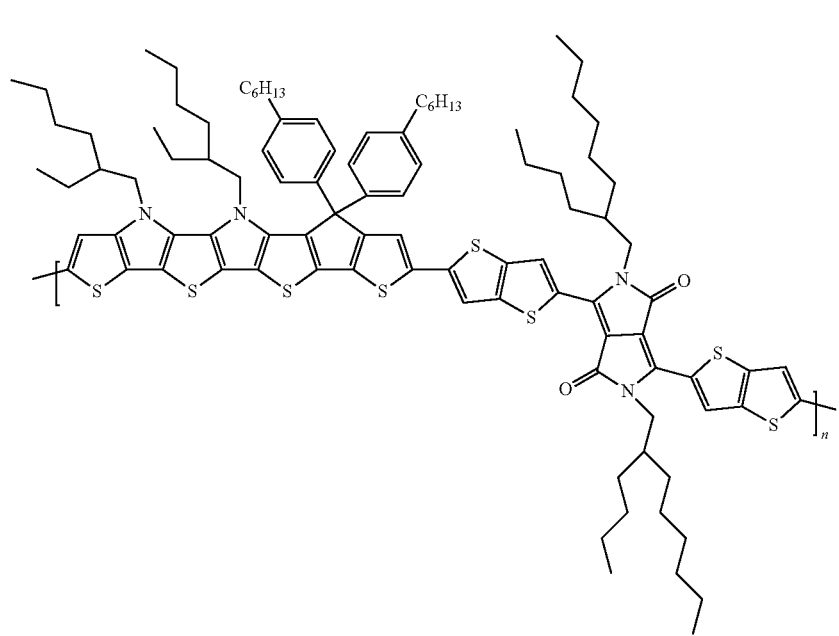
12

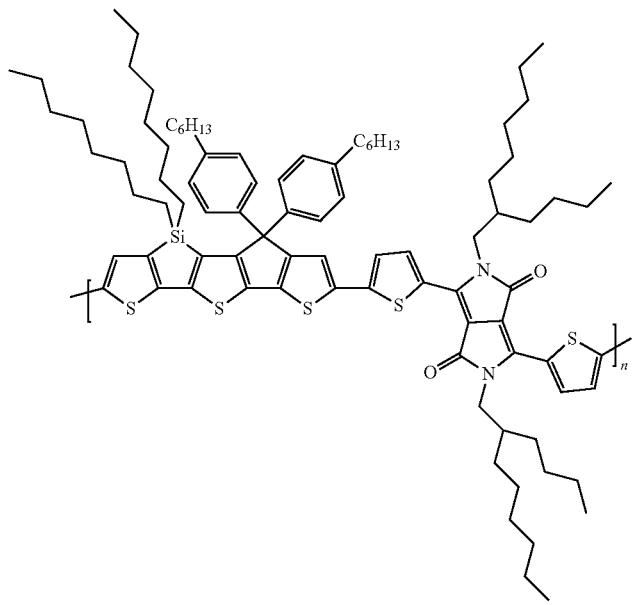

13

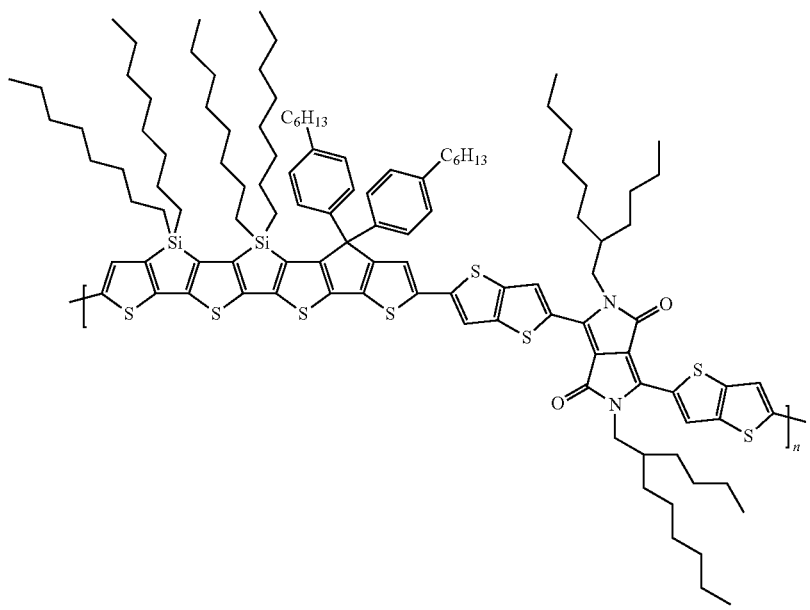

14

TABLE 2

Performances of perovskite solar cells in Examples 10-14
(Light intensity was measured under the exposure
condition of 100 mW/cm² AM1.5G)

| Compound | $V_{oc}$ (V) | $J_{sc}$ (mA cm$^{-2}$) | FF (%) | PCE (%) |
|---|---|---|---|---|
| 10 | 1.01 | 24.03 | 69.85 | 16.9 |
| 11 | 0.99 | 22.05 | 65.88 | 14.38 |
| 12 | 0.95 | 21.02 | 60.58 | 12.10 |
| 13 | 1.03 | 21.34 | 70.12 | 15.41 |
| 14 | 1.02 | 21.10 | 69.89 | 15.04 |

Thus, the compound of the present application has good heat stability, controllable absorption level, and is suitable for the preparation of hole transport materials of efficient, flexible, large-area and high-performance perovskite solar cells having good stability as well as donor materials of organic solar cells.

It can be understood from the mentioned above that the specific embodiments of the present application are described for the purpose of achieving exemplary description, and moreover, a person skilled in the art can make various transformations or improvements within the spirit and protection scope of the present application. These transformations or improvements shall fall within the scope of the claims appended herein.

The invention claimed is:

1. A preparation method of an asymmetric organic polymer, comprising:
    dissolving, in a 25 mL three-necked bottle, 80 mg of compound 8 and 137 mg of compound 9 in a mixture of 4.5 mL of toluene and 0.5 mL of N, N-dimethylformamide, bubble with nitrogen for 15 minutes;

adding 5.17 mg of Pd2 (dba) 3 and p-(o-tol) 6 mg;

heating and refluxing for 4 hours to produce a solution;

stopping the heating immediately after the solution is viscous;

cooling the solution, and loading the solution into 100 mL of anhydrous methanol for sedimentation;

filtering by suction;

using a Soxhlet extractor for purification; and using column chromatography for secondary purification to obtain 100.1 g of blue-black solid, wherein the reaction formula is as follows:

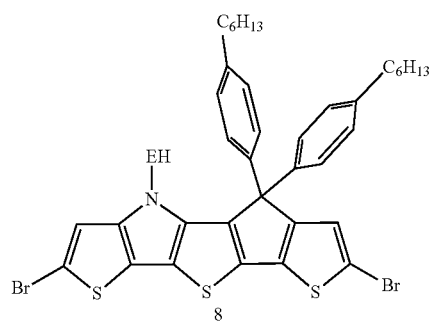
8

+

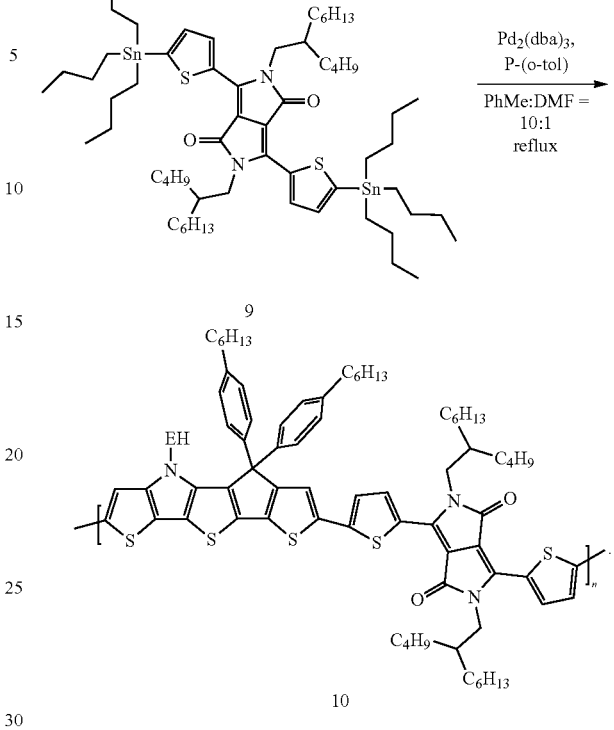

* * * * *